(12) United States Patent
Agrawal et al.

(10) Patent No.: US 6,661,254 B1
(45) Date of Patent: Dec. 9, 2003

(54) PROGRAMMABLE INTERCONNECT CIRCUIT WITH A PHASE-LOCKED LOOP

(75) Inventors: Om P. Agrawal, Los Altos, CA (US);
Jinghui Zhu, San Jose, CA (US);
Kuang Chi, San Jose, CA (US);
ChienKuang Chen, Sunnyvale, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 38 days.

(21) Appl. No.: 10/021,873

(22) Filed: Dec. 14, 2001

(51) Int. Cl.[7] .............................. H01L 25/00; H03L 7/06
(52) U.S. Cl. ...................... 326/41; 326/38; 327/159; 327/156; 331/25
(58) Field of Search ..................... 326/93, 38; 327/156, 327/159; 331/25, 34, 45, 57

(56) References Cited

U.S. PATENT DOCUMENTS

| 6,034,541 A | 3/2000 | Kopec, Jr. et al. |
| 6,177,844 B1 * | 1/2001 | Sung et al. .................... 331/25 |
| 6,218,876 B1 * | 4/2001 | Sung et al. .................. 327/156 |

* cited by examiner

Primary Examiner—Daniel Chang
(74) Attorney, Agent, or Firm—MacPherson Kwok Chen & Heid LLP (57) ABSTRACT

A programmable interconnect circuit includes a phase-locked loop configured to provide an internal clock signal to I/O cells in the programmable interconnect circuit such that registers in the I/O cells may all be clocked in phase. In addition, the phase-locked loop may provide an external clock signal to the programmable interconnect circuit's routing structure such that external devices may clocked in phase with the external clock signal.

16 Claims, 9 Drawing Sheets

PROGRAMMABLE INTERCONNECT CIRCUIT WITH A PHASE-LOCKED LOOP

RELATED APPLICATIONS

This application is related to U.S. applications "Block Oriented Architecture for a Programmable Interconnect Circuit," Ser. No. 10/022,464, "Multi-Level Routing Structure for a Programmable Interconnect Circuit," Ser. No. 10/023,053, and "I/O Block for a Programmable Interconnect Circuit," Ser. No. 10/021,844 all concurrently filed herewith, the contents of all of which are hereby incorporated by reference in their entirety.

FIELD OF THE INVENTION

This invention relates to programmable interconnect circuits, and more particularly to a programmable interconnect circuit having an architecture suitable for bus switching applications.

DESCRIPTION OF RELATED ART

In-system-programmable interconnect devices permit a user to programmably route signals between pins of the device. For example, Lattice Semiconductor Corp. currently manufactures an ispGDX® family of programmable interconnect devices having a non-volatile $E^2CMOS$® in-system-programmable crossbar switch matrix for programmable switching, interconnect, and jumper functions. Each pin of the ispGDX® device is associated with an input/output (I/O) circuit that programmably couples to other I/O circuits through a routing structure denoted as a global routing pool (GRP). The I/O circuits contain registers allowing the input and output signals on the associated pins to be selectively registered.

Figure 1:
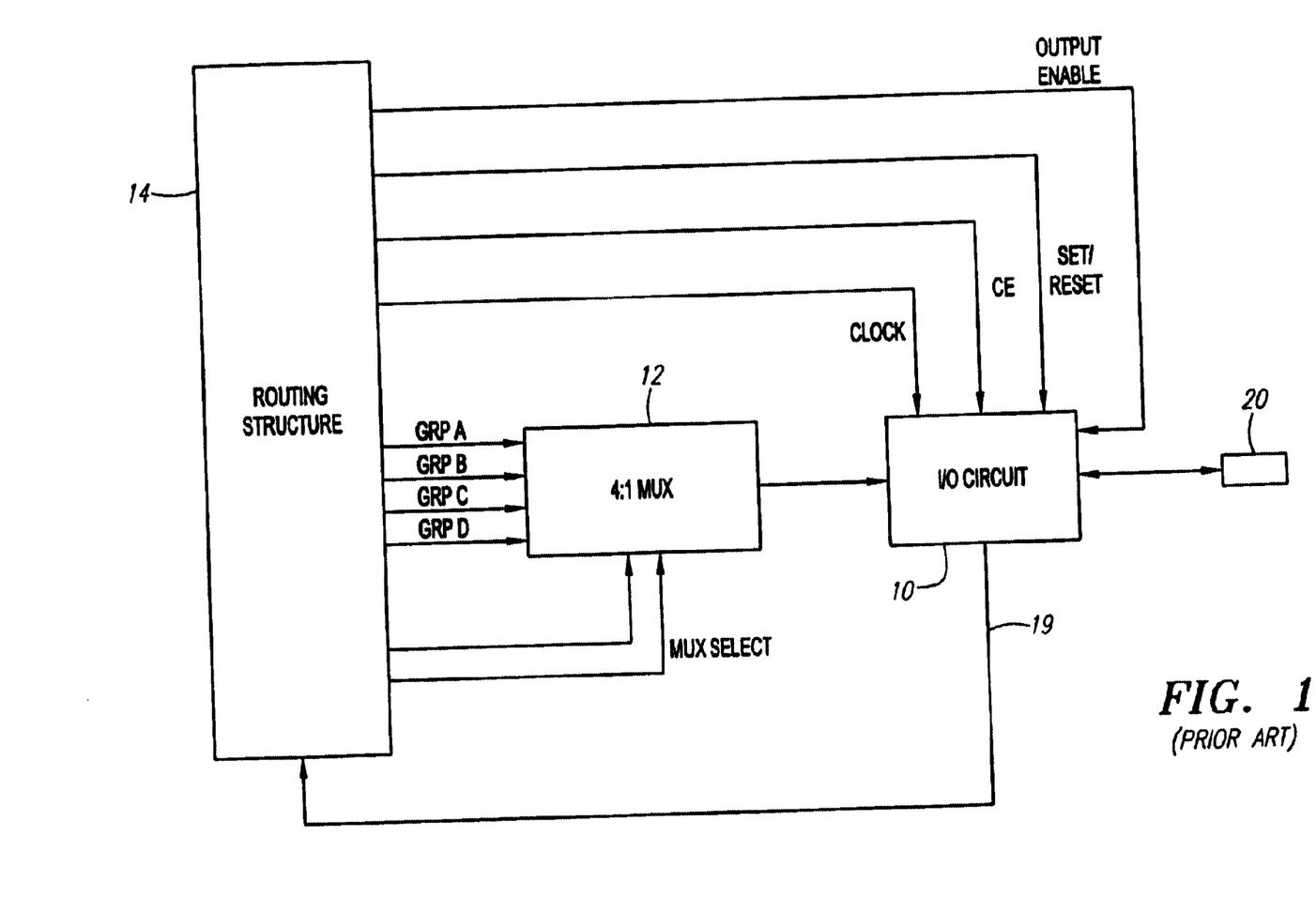
FIG. 1 illustrates a prior art programmable interconnect architecture.

Referring now to FIG. 1, an input/output circuit 10 for an ispGDX® device couples to a 4:1 multiplexer (Mux) 12 that receives signals A, B, C, and D from four different routing structures, GRP_A, GRP_B, GRP_C, and GRP_D, (not illustrated) respectively. Each routing structure corresponds to a given quadrant (a side of the integrated circuit) for the device. Accordingly, GRP_A receives the input signals from I/0 pins 20 in quadrant A, GRP_B receives the input signals from I/0 pins 20 in quadrant B, and so on. Input/output circuit 10 receives its input signals from its pin 20 and directs them to the appropriate global routing structure on path 19. For example, if I/0 circuit is within quadrant A, path 19 would couple to GRP_A.

Each routing structure is a switch matrix that may receive input signals from selected I/O circuits and programmably route output signals to selected I/O circuits. For clarity, the individual structures are grouped together and jointly designated by a single routing structure 14. A similar device or circuit is disclosed in U.S. Pat. No. 6,034,541, the contents of which are hereby incorporated by reference in their entirety. In addition, each global routing pool has a switch matrix fused by an in-system-programmable non-volatile $E^2CMOS$® memory bank, configured for one-way routability. A given memory cell in the volatile $E^2CMOS$® memory bank controls the state of a "fuse point" in the switch matrix. The fuse point may be formed by, e.g., a pass transistor that will programmably connect an input lead of the switch matrix to an output lead of the switch matrix, depending upon the logical state (high or low) of the fuse point's memory cell. I/O pins 20 to the device are arranged in quadrants (the four sides to the chip) such that an individual routing structure receives signals from the I/O circuits 10 in a single quadrant and may distribute these signals to the I/O cells 10 in all four quadrants. Thus, the four input signals A, B, C, and D for each Mux 12 are "quadrant" limited to originate in their respective quadrants. Note that, with respect to routing structure 14, each I/O circuit 10 is independent and separate from the remaining I/O circuits. Because routing structure 14 distributes signals independently to each I/O circuit 10, the resulting arrangement may be denoted as "pin-oriented" or "bit-oriented" in that each I/O circuit 10 associates with a single I/O pin 20.

Similar to the data signals, control signals, such as the set/reset, clock, and clock enable (CE) for an input/output register (not illustrated) located within I/O circuit 10, the output enable (OE) for an output buffer (not illustrated) located within I/O circuit 10, as well as the MUX selects for MUX 12, are also limited to originating in a subset of pins 20 from each quadrant. Moreover, the prior art device had no control logic capability for these control signals such that the control function for each signal was limited to a single pin.

Although this "bit-oriented" architecture allowed a user to programmably interconnect signals through the device, the number of fuses in the resulting global routing pool becomes prohibitive as the pin count increases. However, modern board density continues to increase, demanding an interconnect device having a suitable number of pins to interconnect the signals. In addition, board clock speeds continue to increase, making clock skew problematic and clock distribution increasingly difficult.

Accordingly, there is a need in the art for an improved programmable interconnect device that uses fewer fuses and provides the capability for distributing a clock signal through its routing structure.

SUMMARY

In accordance with one aspect of the invention, a programmable semiconductor device includes a plurality of input/output (I/O) cells, each I/O cell having a register associated with a pin. A routing structure couples to the I/O cells and is configured to receive a signal from each I/O cell's register and programmably route the received signal to any of the remaining I/O cells' registers. A phase-locked loop (PLL) is operable to receive an external clock signal and provide an internal clock signal to the registers in the I/O cells, whereby the registers in the I/O cells may all be synchronously clocked with respect to the external clock signal.

The invention will be more fully understood upon consideration of the detailed description below, taken together with the accompanying drawings.

BRIEF DESCRIPTION OF THE DRAWINGS

Use of the same reference symbols in different figures indicates similar or identical items.

DETAILED DESCRIPTION OF THE PREFERRED EMBODIMENTS

Figure 2:
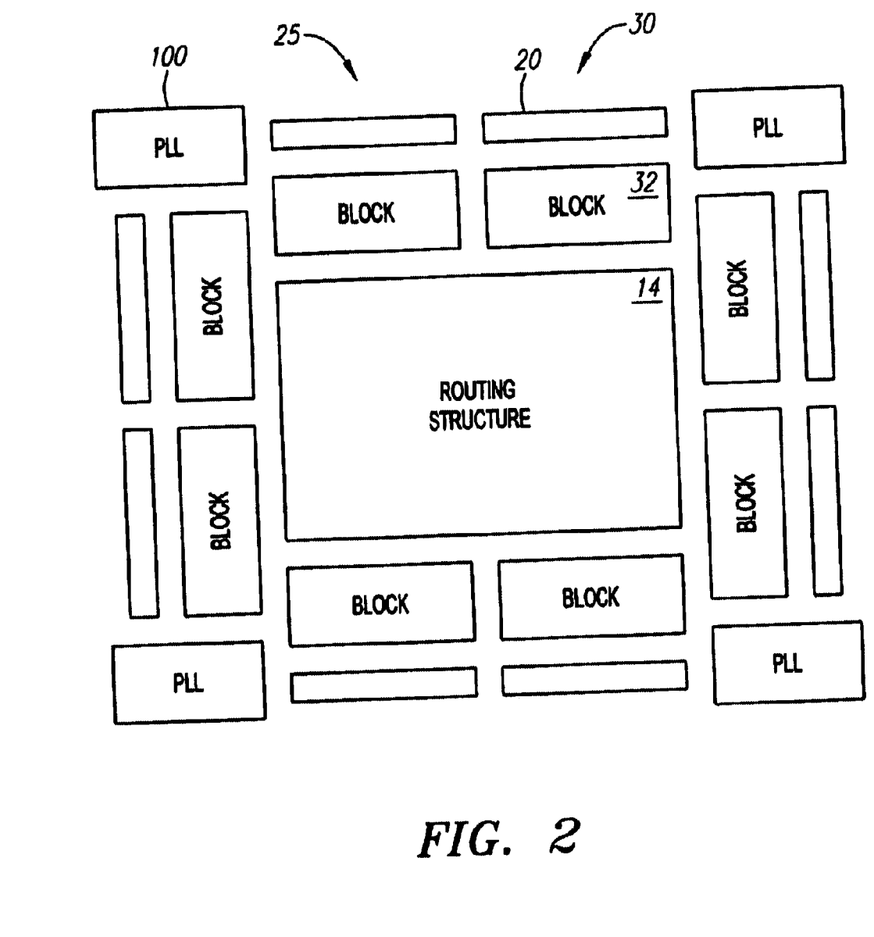
FIG. 2 illustrates a block-oriented architecture for a programmable interconnect circuit according to one embodiment of the invention.
Figure 3:
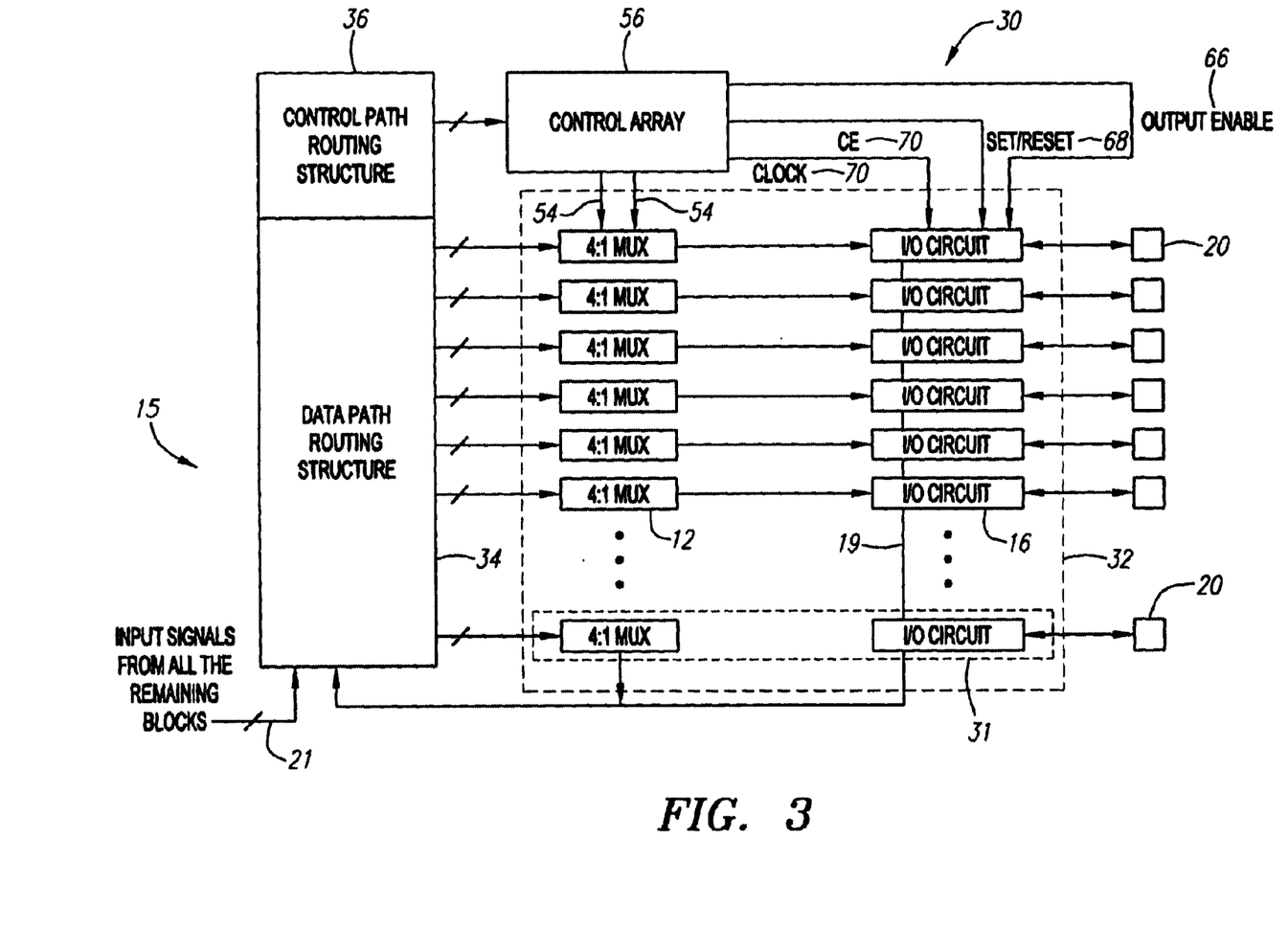
FIG. 3 illustrates further aspects of block-oriented architecture for the programmable interconnect circuit of FIG. 2 according to one embodiment of the invention.

Referring now to FIGS. 2 and 3, a "block-oriented" programmable interconnect architecture 30 is illustrated. In contrast to the "bit-oriented" architecture of the prior art, the I/O circuits 16 (FIG. 3) are arranged in I/O blocks 32 such that each block 32 having a plurality X of I/O circuits 16 associates with its own routing structure 15 (FIG. 3). In general, X is arbitrary as any number of I/O circuits 16 may be assigned to an I/O block 32. However, because bus-switching applications typically route binary signals in groups of 8 (one byte) or 16 (two bytes), assigning 16 I/O circuits per I/O block 32 as illustrated in FIG. 3 is particularly convenient. It will be appreciated, however, that other numbers of I/O circuits per I/O block may be used, for example, 4 or 8. Each I/O circuit 16 may be contained within an I/O cell 31, which also includes a 4:1 Mux 12 for selecting data signal inputs for its I/O circuit 16 (for clarity, only one I/O cell 31 is illustrated in FIG. 3). In FIG. 2, the routing structures 15 are collectively denoted as a single routing structure 14. Referring again to FIG. 3, each I/O circuit 16 may receive input signals from its pin 20. These input signals may comprise data signals that will ultimately be routed to other pins 20. Alternatively, these input signals may comprise control signals for controlling, for example, multiplexers 12 or registers within I/O circuits 16.

As will be described further herein, interconnect device 25 is programmable because of its association with a programmable memory (not illustrated), which is typically non-volatile but may be implemented as a volatile memory if desired. A user would program memory elements within the programmable memory to desired logic levels. These memory elements then control programmable elements such as fuse points, multiplexers, and switches within interconnect device 25 so as to effect a desired mode of operation. The programmable memory is preferably in system programmable, such that a user may change the programming during operation of the interconnect device.

Each I/O block 32 may receive signals from two independent routing structures contained within routing structure 15: a data-path routing structure 34 for programmably routing data signals, and a second control-path routing structure 36 for programmably coupling control signals to a control array 56, which in turn provides product-term control signals to I/O block 32. It will be appreciated that although data-path routing structure 34 and the control-path routing structure 36 are independent, such independence may be conceptual only in that the data-path routing stricture 34 and control-path routing structure 36 may be combined into a single global routing structure. For example, a single switch matrix may accommodate both data and control signals. However, the fuse patterns within the switch matrix or global routing structure may differ according to whether data signals or control signals are being routed.

As will be explained further herein, the control array 56 within I/O block 32 produces a set of product-term control signals. One set of product-term signals provides the MUX select signals 54 for the 4:1 MUXes 12. Each I/O circuit 16 may include an input register 90, an output register 92, and an output enable register 94 discussed with respect to FIG. 7. Other sets of product-term signals from the control array 56 provide the clock and clock enable (CE) signals 70, the set/reset signals 68 and the OE signals 66 for these registers.

Figure 4:
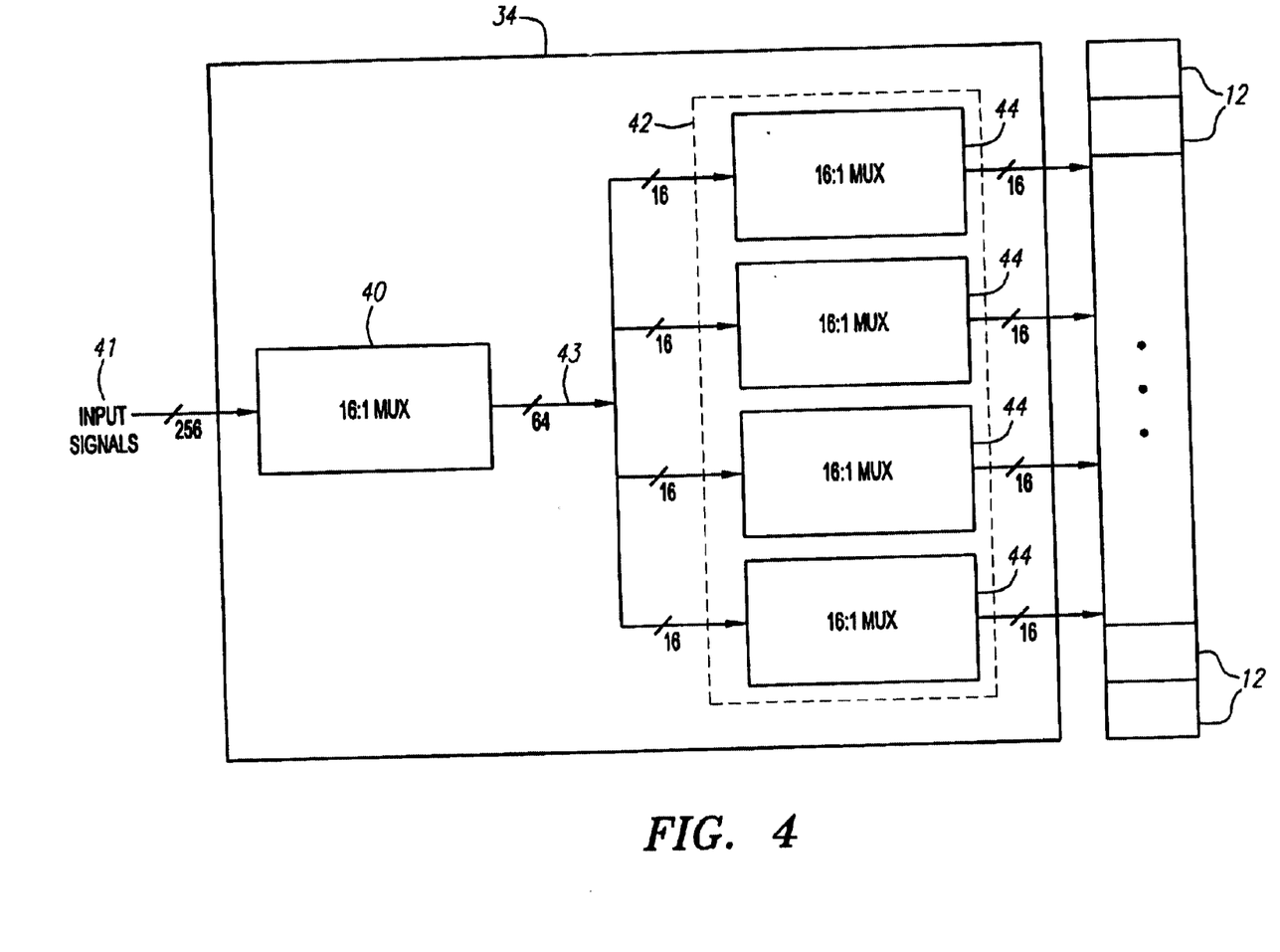
FIG. 4 illustrates a two level data-path routing structure according to one embodiment of the invention.

Arranging the I/O circuits 16 into I/O blocks 32 allows each data-path routing structure 34 and control-path routing structure 36 to be arranged in a two-level organization. The following discussion will summarize this two level organization, which is described more fully in the co-pending application entitled "Multi-Level Routing Structure for a Programmable Interconnect Circuit," concurrently filed herewith. As shown in FIG. 4, data-path routing structure 34 may comprise a first level data-path routing structure 40 and a second level data-path routing structure 42. First level data-path routing structure 40 receives input signals 41 that may originate from pins 20 corresponding to all I/O blocks 32 of the device. Each pin 20 associates with an I/O circuit 16. Thus, if there are 256 I/O circuits 16, first level data-path routing structure 40 may receive 256 input signals 41. To reduce the fuse count, first level data-path routing structure's switch matrix (not illustrated), which may be fused by a non-volatile memory bank (not illustrated), is only partially populated, thereby forming an M:1 MUX for each output signal carried on bus 43, where M corresponds to the ratio of the total number of input signals 41 feeding first level data-path routing structure 40 to the number of I/O circuits 16 within the first level data-path routing structure's I/O block 32. Accordingly, given that I/O blocks 32 each have a fixed number X of I/O cells, the total number of input signals 41 feeding first level data-path routing structure 40 becomes (N * X), where N is the total number of I/O blocks 32. M then equals (N * X)/X, which equals N, the total number of I/O blocks. Thus, the M:1 MUX formed for each output on bus 43 of first level data-path routing structure 40 depends upon the number of I/O blocks 32 within the device. If there are sixteen I/O blocks 32, the fuse pattern within first level data-path routing structure 40 may be such that it forms a 16:1 MUX for each output signal carried on bus 43. Similarly, because the 4:1 MUX 12 (FIG. 3) coupled to each I/O circuit 16 (FIG. 3) receives 4 input data signals, an I/O block 32 having sixteen I/O circuits requires 64 input data signals. In such an embodiment, first level data-path routing structure 40 will thus have a 64 bit wide output bus 43. The resulting switch matrix (not illustrated) for this embodiment of a first level data-path routing structure 40 is four-way routed in that each input signal has four different paths it may take to reach the output In other words, an input lead to the first level data-path routing structure 40 may have four fuse points connecting it to output leads, providing the four different paths. Such a switch matrix is more filly discussed in copending "Multi-Level Routing Structure for a Programmable Interconnect Circuit," concurrently filed herewith.

Figure 5:
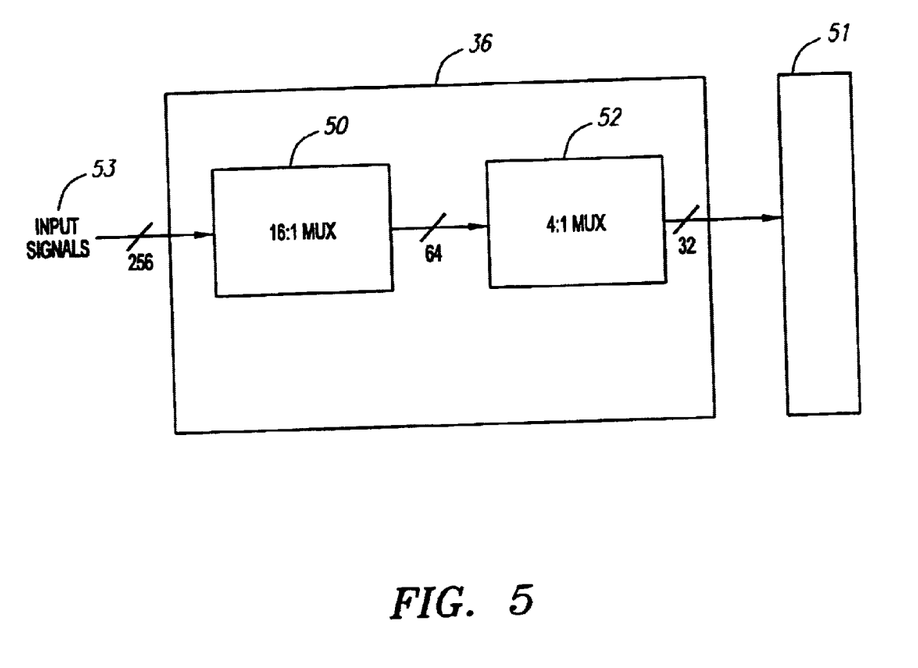
FIG. 5 illustrates a two level control-path routing structure according to one embodiment of the invention.

To permit increased flexibility in signal routing to any given 4:1 Mux 12 within the I/O block 32 associated with first level data-path routing structure 40, a second level data-path routing structure 42 couples the first level data-path routing structure 40 to the I/O block 32. The switch matrix (not illustrated) for the second level data-path routing structure 42 may be fully populated to provide this increased flexibility. This switch matrix may be fused by a non-volatile in-system-programmable memory bank. Second level data-path routing structure 42 may be conceptually organized into groups of X signals corresponding to the number X of I/O circuits 16 assigned to any given I/O block 32. For an X=16 architecture, the resulting second level data-path routing structure 42 is organized into four blocks 44, each corresponding to a consecutive group of 16 signals on bus 43 from first level data-path routing structure 40. Each block 44 provides 16 signals to drive four 4:1 MUXes 12. Thus, each block 44 receives 16 signals and programmably routes these signals into 16 output signals. Because any particular one of the received 16 signals may be routed to become any particular one of the 16 output signals, block 44 forms a 16:1 Mux for each of the 16 output signals. These 16 output signals become the input signals for four 4:1 multiplexers 12 within the I/0 block 32 associated with tile particular data-path routing structure 34. Note that the 16 input signals for each block 44 (provided by the first level data-path routing structure 40) are derived from any 16 of the 256 input signals. Because the block 44 in the second level data-path routing structure 42 receiving these 16 signals has a fully-populated switch matrix, the four inputs for any given 4:1 Mux 12 can come from any of the 256 input signals. This routing is advantageous over the prior art architecture discussed with respect to FIG. 1. The inputs to the 4:1 Mux 12 (FIG. 3) are no longer "quadrant" restricted, in that the four inputs to each 4:1 Mux 12 can come from one side, two sides, three sides, or all four sides of the device. In addition to removing the quadrant restriction of the prior art, the two-level organization for data-path routing structure 34 provides a significant reduction in fuse count A similar two-level organization may be used for the control-path routing structure 36. Thus, control path routing structure 36 may comprise a first level control-path routing structure 50 and a second level control-path routing structure 52. As shown in FIG. 5, for a device having 256 I/O circuits 16, a first level control-path routing structure 50 may receive 256 input signals 53. The switch matrix (not illustrated) is fused such that each output of the first level control path routing structure 50 forms an M:1 Mux corresponding to the total number of I/O blocks 32 as discussed with respect to the first level data-path routing structure 40. In the embodiment illustrated in FIG. 5, the number of I/O blocks 32 (FIG. 3) equals 16 such that the first level control-path routing structure 50 forms a 16:1 Mux for each of its 64 output signals. Thus, the first level control-path routing structure 50 may have a similar fuse pattern to that used for the first level data-path routing structure 40.

However, unlike certain embodiments of second level data-path routing structure 42, there is no need for the second level control-path routing structure 52 to have a fully-populated switch matrix, if an assumption is made about the use of the resulting device. For example, consider the Mux select signals 54 (FIG. 3) required to control the set of 4:1 multiplexers 12 for each I/O block 32. Because each Mux 12 requires two Mux select signals 54, a fully independent Mux control structure would require 32 independent Mux select signals 54. However, in many applications such as bus switching, this level of independence would be wasted because the signals within a given bus are not switched independently and thus would not require independent Mux select signals. Grouping control signals permits the second level control-path routing structure 52 to have a partially-populated switch matrix (not illustrated) fused such that it forms a 4:1 Mux for each of 32 output signals. It will be appreciated that the number of output signals is arbitrary and results from a trade-off between fuse count and flexibility. These same design considerations control whether the second level control-path routing structure 52 has a fully or partially-populated switch matrix.

Figure 6:
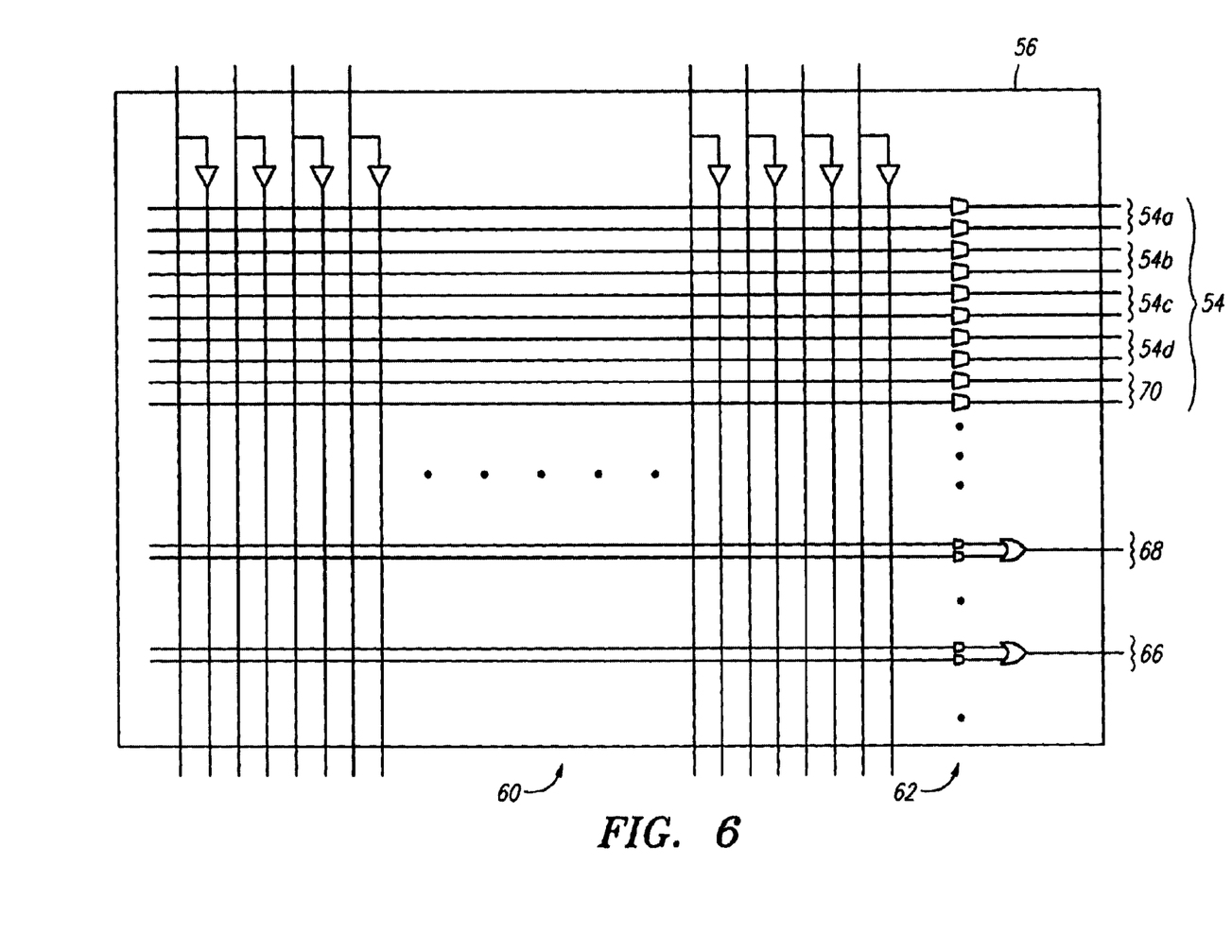
FIG. 6 illustrates a control array for generating product-term control signals according to one embodiment of the invention.

To generate independent control functions for the control signals developed by the control-path routing structure 36, the control array 56 within I/O block 32 (FIG. 3) has an AND array 60 to form product-terms 62 as illustrated in FIG. 6. The control array receives both the true and complement of the outputs from the second level control-path routing structure 52 (illustrated in FIG. 5). For an embodiment having 32 output signals from the second-level control-path routing structure 52, AND array 60 thus receives 64 signals. The number of product terms 62 derived from the AND array 60 depends upon the balance desired between fuse count and flexibility, just as discussed with respect to the second level control-path routing structure 52. In other words, increasing the number of product term outputs from the AND array 60 will increase the flexibility in the control options available to the user. However, increasing the number of product term outputs will increase the required number of fuses, increasing costs. As shown in FIG. 3, desired control signals include the Mux selects 54 for the 4:1 multiplexers 12, output enable signals (OE) 66, set/resets 68, clock and clock enable (CE) signals 70. In the embodiment illustrated in FIG. 6, AND array 60 produces 20 control signals: 8 product-terms Mux selects 54, four product-term clock/clock enable signals 70, four product-term set/resets 68, and four product-term OE signals 66. It will be appreciated that the actual number of each type of product-term control signal produced by the AND array 60 is arbitrary and is driven by a tradeoff between fuse count and control function flexibility. Further details of the control functions provided by the AND array 60 are described in co-pending U.S application "I/O Block for a Programmable Interconnect Circuit," concurrently filed herewith. Because each 4:1 Mux 12 (FIG. 3) in an I/O cell 31 requires two Mux select signals, a fully independent control of all 16 multiplexers 12 within I/O block 32 of FIG. 3 requires 32 Mux select signals. However, as discussed with respect to the second level control-path routing structure 52 of FIG. 5, control signals may be shared between I/O cells 31 within an I/O block 32 if a bus-switching application is assumed. Thus, for the embodiment illustrated in FIG. 6, the product-term Mux select signals 54 are arranged in sets 54a through 54d of two product-term signals each, thereby resulting in sharing of control signals. For example, product-terms 54a could control four of the 4:1 multiplexers 12 within an I/O block 32 (FIG. 3), set 54b would control another four, and so on. In such an arrangement, the four multiplexers 12 having common Mux select signals 54 cannot be switched independently. Referring back to FIG. 3, each 4:1 Mux 12 for each cell 31 within I/O block 32 receives 4 data signals on data signal paths that are independent from Mux 12 to Mux 12 within I/O block 32. However, each 4:1 Mux 12 within a cell 31 may not have such independence for its control signals (Mux select signals 54). Instead, each 4:1 Mux 12 for each cell 31 within I/O block 32 receives 2 Mux select signals 54 on control signal paths that may be shared among a plurality of multiplexers 12 within I/O block 32. For the embodiment discussed with respect to FIG. 6, this plurality of multiplexers 12 sharing Mux select signals 54 is four.

Figure 7:
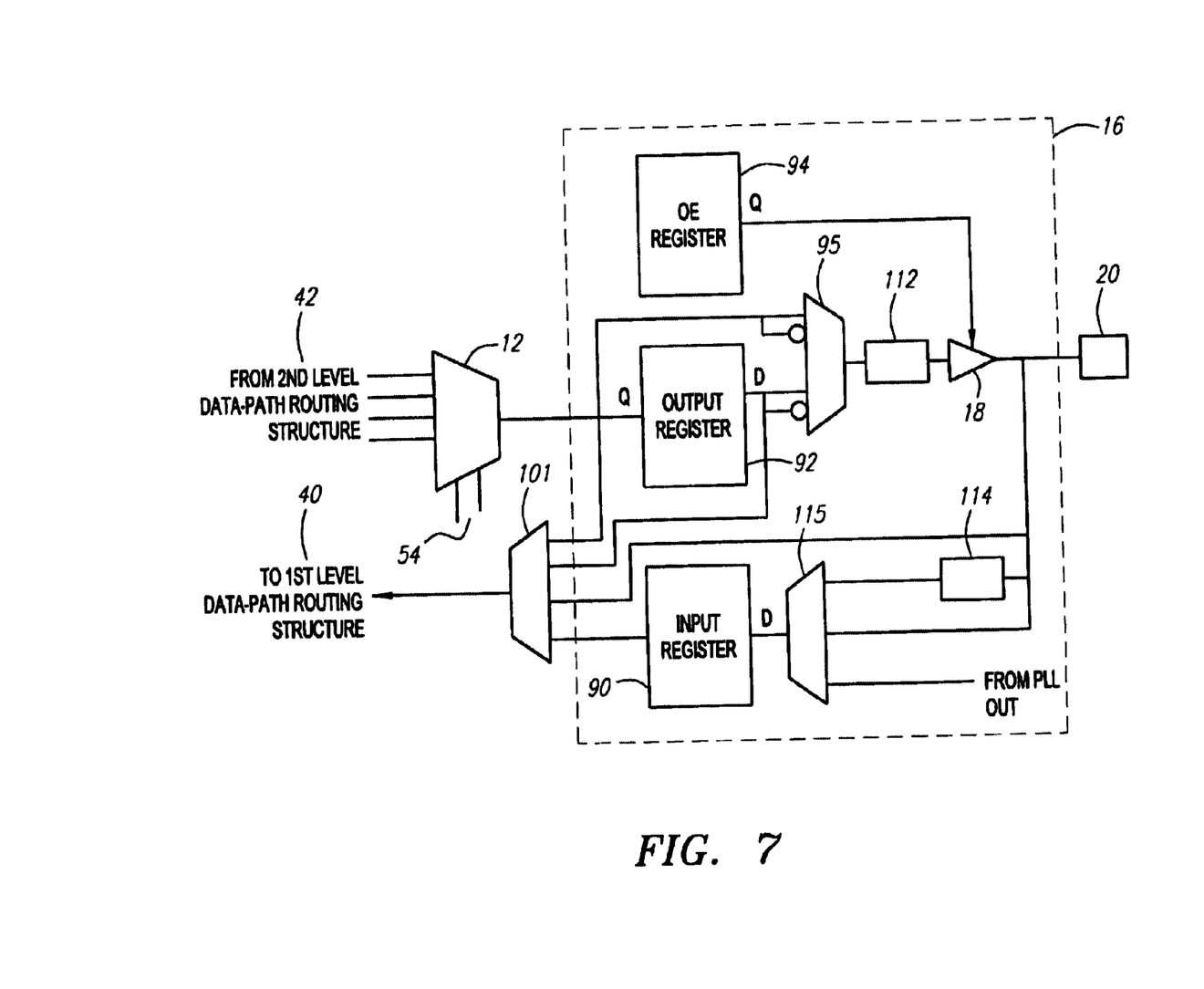
FIG. 7 is a block diagram for an I/O cell according to one embodiment of the invention.

Turning now to FIG. 7, an embodiment for the I/O circuit 16 of FIG. 3 has its input register 90 and output register 92 separated, providing true bi-directional input and output capabilities. Although such bi-directional capability is advantageous, the block-oriented architecture 30 of the present invention may be implemented without separate input and output registers in I/O circuit 16. The output register 92 receives the output of 4:1 MUX 12 and provides a registered output signal Q that may be coupled to an output buffer 18, which in turn may provide an output signal to its pin 20. An OE register 94 controls the output buffer 18. Input register 90 may receive an input signal coupled from pin 20. A feedback or input MUX 101 for the I/O cell 31 selects outputs from the 4:1 MUX 12, the output register 92, the pin 20, and the input register 90, providing a fast feedback path to its I/O block's routing structure 15.

An output register bypass MUX 95 selects between either the registered output Q of output register 92 or the unregistered output of 4:1 MUX 12. In this fashion, output buffer 18 may receive either a registered or unregistered output signal. In addition, the output register bypass MUX 95 provides polarity control for either output signal. To prevent ground bounce, output register bypass MUX 95 couples to output buffer 18 through a programmable delay element 112. Similarly, another programmable delay element 114 adjusts the hold time of the input register 90. The data input for input register 90 is provided by an input selection MUX 115. Input selection MUX 115 may select between the output of programmable delay element 114 or an undelayed input from pin 20. Each register 90, 92, and 94 and the 4:1 MUX 12 within the I/O circuit 16 receives product-term control signals from the control array 56 (FIG. 6). The product-term MUX select signals 54 couple through polarity selection MUXes (not illustrated) to the 4:1 MUX 12. Each register 90, 92, and 94 may also receive product-term clock, clock enable, set and reset signals. The coupling of these product-term register control signals is further described in copending U.S. Applications "Block-Oriented Architecture for a Programmable Interconnect Circuit," and "I/O Block for a Programmable Interconnect Circuit."

Figure 8:
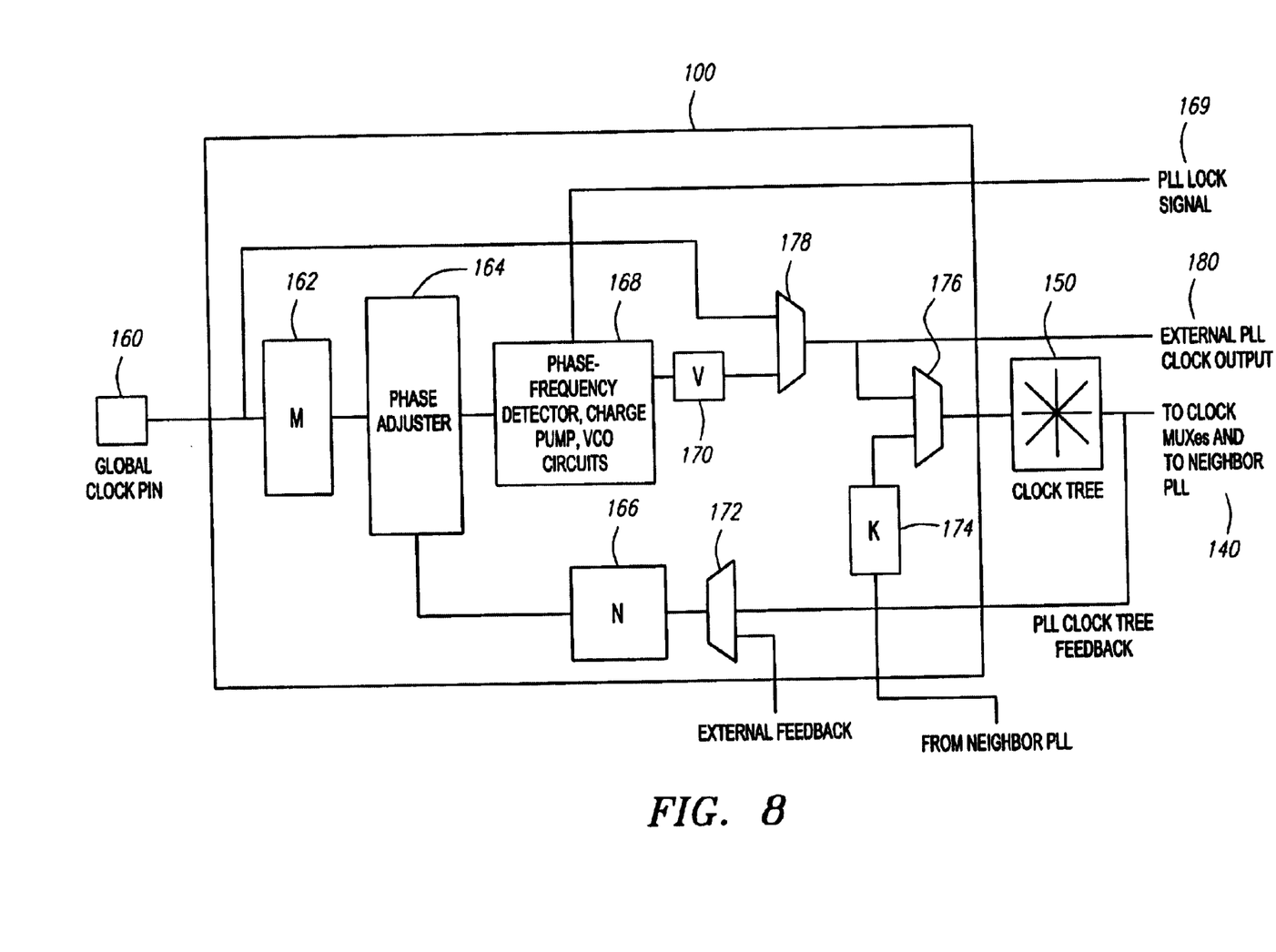
FIG. 8 is a block diagram for a phase-locked loop of the programmable interconnect circuit of FIG. 2.

In addition to the product-term clock and clock enable (CE) signals 70 (FIG. 6), global clock and clock enable signals are also distributed to the registers. Turning now to FIG. 8, these global signals couple to programmable interconnect device 25 through dedicated global pins 160. To control clock skew and permit clock synthesis, each global clock/clock enable signal is associated with a phase-locked loop (PLL) such as PLL 100 (also illustrated in FIG. 2). Thus, should there be four global clock signals, there will be four PLLs 100. Each PLL 100 may receive a global clock signal on pin 160 and provide a PLL clock output 140 that may be a scaled version of the respective global clock signal. The scaling occurs as follows. PLL 100 receives its global clock signal at a reference clock divider unit 162, which may divide the reference clock signal by an integer M number of units and provide the divided output to a phase adjustor unit 164. Phase adjustor unit 164 adjusts the phase of the divided output signal according to a feedback signal from feedback clock divider unit 166. In response to the phase adjusted output from phase adjustor 164, phase-frequency detector, charge pump, and VCO circuits (represented by unit 168) provide an unscaled clock output to VCO post-scaler unit 170. In addition, unit 168 will generate a PLL lock signal 169 to indicate whether PLL 100 has locked onto the global clock signal provided on pin 160. Post-scaler unit 170 scales the frequency of the unscaled clock signal from unit 168 to produce a PLL clock output signal 140 that may couple through an output bypass multiplexers 178 and an output selection multiplexer 176 to a clock tree 150. Clock tree 150 is configured to ensure that the PLL clock outputs 140 will arrive in phase at the various registers 90, 92, and 94 within I/O cells throughout programmable interconnect device 25. Typically, place and route software tools are used to design a clock tree to minimize clock skew and power dissipation. The software tools vary the placement of the clock tree routing paths and the clocked cells (such as registers 90, 92, and 94) to achieve these goals. From clock tree 150, PLL clock outputs 140 couple to the clock/clock enable inputs (not illustrated) for each register 90, 92, and 94 through clock multiplexers (not illustrated). Each clock MUX may select between the PLL clock outputs signals 140 and either the product-term clock and clock enable (CE) signals 70 as determined by whether the clock MUX couples to a clock or clock enable input. To close the feedback loop for PLL 100, PLL clock signal 140 couples back to feedback clock divider unit 166 through a feedback multiplexer 172.

Clock divider units 166 and 162 as well as VCO post-scalar 170 permit a user to adjust the frequency of PLL clock output 140 with respect to the global clock signal carried on pin 160. However, even greater flexibility in frequency adjustment may be derived from coupling adjacent PLLs 100 together. For example, as illustrated, an adjacent or neighbor PLL 100 may provide a clock output to a PLL output clock post-scaler unit 174. Using PLL output clock post-scaler unit 174, a high frequency global clock signal may be scaled down into the KHz range. An output selection MUX 176 may select between either the output of PLL output clock post-scaler unit 174 or the output of bypass MUX 178 to provide a PLL clock output 140 to clock tree 150. Bypass MUX 178 may select between an unadjusted global clock signal from pin 160 or the scaled output of VCO post-scaler 170. From clock tree 150, PLL clock output 140 may couple to neighboring PLLs so that these units may also provide greater output frequency flexibility. Each PLL's output clock post-scaler unit 174 may receive a PLL clock output 140 from one of its neighboring PLLs in the following fashion. Each PLL 100 may be designated with a number, e.g., if there are four PLLs 100, they may be numbered as PLL-0 through PLL-3. PLL-0 would receive PLL clock output 140 from PLL-1. PLL-1 would receive PLL clock output 140 from PLL-2. PLL-2 would receive PLL clock output 140 from PLL-3. Finally, PLL-3 would receive PLL clock output 140 from PLL-0 to complete the chain.

As just described, a PLL clock signal 140 (as derived from a global clock signal) may couple through clock tree 150 to clock inputs of input register 90, output register 92, and output enable register 94 for selected I/O cells. In this fashion, registers 90, 92, and 94 may be clocked in phase with a global clock signal independently of any signal from its routing structure 15. However, using routing structure 15, an external PLL clock output 180 (produced as the output of bypass MUX 178) may also be routed outside of programmable interconnect device 25 to external devices. These external devices may then be clocked in phase with the PLL clock output as follows.

Figure 9:
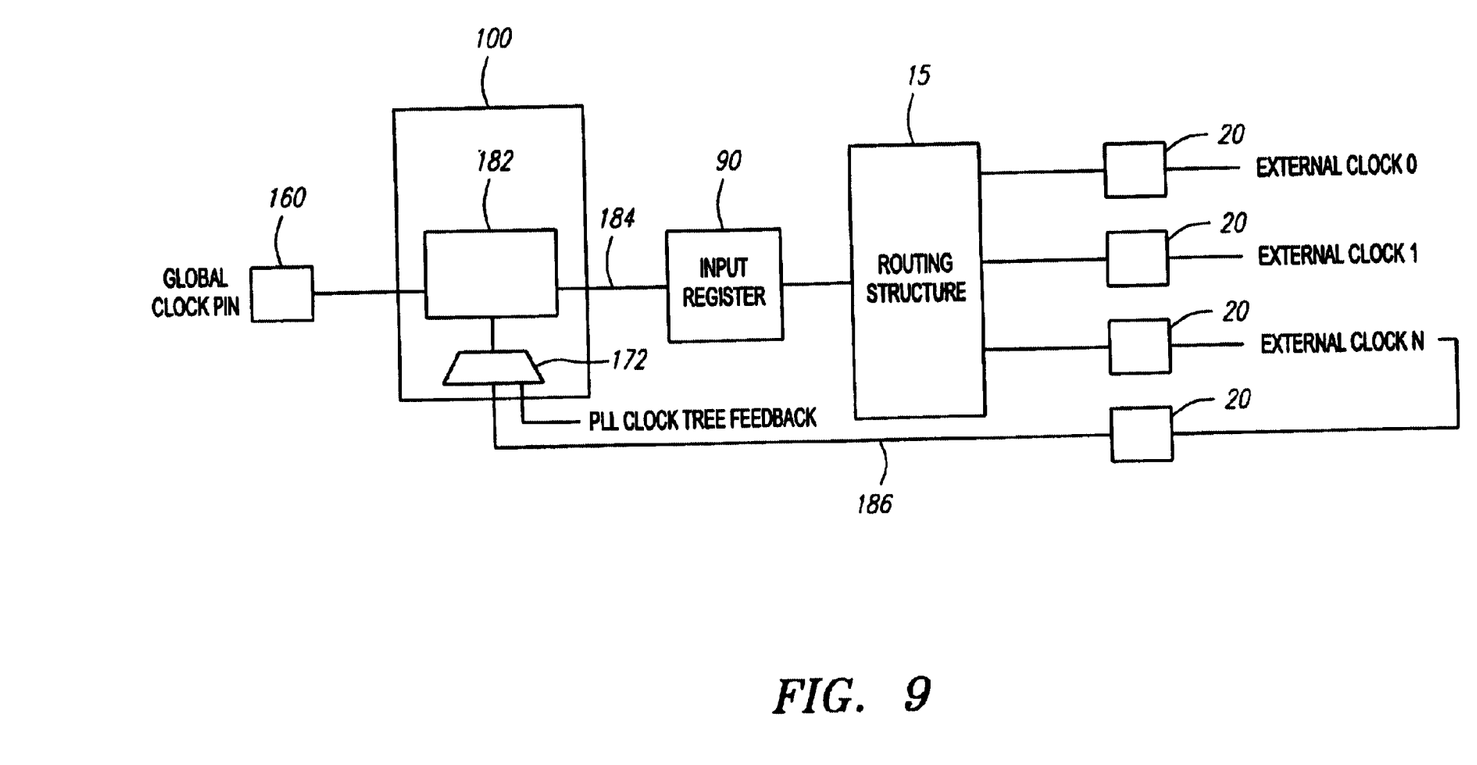
FIG. 9 illustrates the signal paths used by the phase-locked loop of FIG. 8 when configured to provide a clock signal for external devices.

Turning now to FIG. 9, the distribution of external PLL clock output 180 to external devices is illustrated. PLL 100 receives a global clock signal carried on global clock pin 160 as described with respect to FIG. 8. The various components of PLL 100 shown in FIG. 8 involved in producing external PLL clock output 180 (FIG. 8) are lumped together in block 182. Because external PLL clock output 180 will not be used internally to clock registers within programmable interconnect device 25, external PLL clock output 180 need not be coupled through a clock tree. Instead, external PLL clock output 180 couples to an input register 90 over a dedicated path 184. Referring back to FIG. 7, dedicated path 184 couples to input selection MUX 115 so that input register 90 may receive the external PLL clock output 180. Input register 90 would be configured in a flow-through latch mode rather than as a D-type flip-flop when coupling external PLL clock output to feedback MUX 101. From feedback MUX 101, external PLL clock output 180 may be coupled to first level data-path routing structure 40, then to second level data-path routing structure 42, then to any desired output register 92, and finally to the desired output register's pin 20. Referring back to FIG. 9, external PLL clock output 180 may be coupled from pins 20 as external clock 0 through external clock N, dependent upon how many pins 20 external PLL clock output 180 has been coupled to. Thus, N external devices may receive these external clock signals. Assuming that the external clocks 0 through N have been distributed using a clock tree, these N external devices would all be clocked in phase. To complete the feedback loop, one of the external clock signals, e.g., external clock N, would be coupled back to programmable interconnect device 25 through a pin 20 to a specialized input register (not illustrated). This input register would be as shown for input register 90 of FIG. 7 but would be coupled to a dedicated path 186. The external clock N feedback signal would couple from the input register (which would also be configured in a flow through mode rather than as a D-type flip-flop) on dedicated path 186 to feedback multiplexer 172. Feedback multiplexer 172 may select either this external feedback signal or the internal PLL clock tree feedback. The output of feedback multiplexer 172 couples to feedback clock divider unit 166, which in turn adjusts phase adjustor 164 to complete the feedback loop.

The fusing of the routing structures 15 to form the programmable interconnect as well as the configuration of the remaining devices may occur through signals stored in non-volatile memory. This non-volatile memory may be in-system programmable. In-system programmable circuits are discussed, for example, in U.S. Pat. No. 5,237,218 to G. Josephson et al., filed on May 3, 1991 and issued on Aug. 17, 1993. The disclosure of U.S. Pat. No. 5,237,218 is hereby incorporated by its entirety to provide background information regarding in-system programmable circuits. In addition to in-system programmability, the programmable interconnect device disclosed herein may also have boundary scan test capability compliant with IEEE Std. 1149.1 (the "JTAG standard"). The JTAG standard, which is set forth in *IEEE Standard Test Access Port and Boundary-Scan Architecture*, published by the Institute of Electrical and Electronics Engineers, Inc. (May 1990) is well-known to those in the art.

Although the invention has been described with reference to particular embodiments, the description is only an example of the invention's application and should not be taken as a limitation. For example, aspects of the invention can be implemented with PLLs having a structure different from the structure of PLL 100. Consequently, various adaptations and combinations of features of the embodiments disclosed are within the scope of the invention as encompassed by the following claims.

We claim:

1. A programmable interconnect circuit, comprising:
a plurality of input/output (I/O) cells, each I/O cell having a register associated with a pin:
a routing structure configured to receive a signal from each I/O cell's register and programmably route the received signal to any of the remaining I/O cells' registers;
a phase-locked loop (PLL) operable to receive an external clock signal and provide an internal clock signal to the resisters in the I/O cells, wherein the PLL is operable to provide a PLL external clock signal derived from the eternal clock signal and to couple the PLL external clock signal to one of the I/O cells, and wherein the routing structure is configurable to distribute the PLL external clock signal to any of the I/O cells' registers such that external devices coupled to the pins associated with the I/O cells receiving the PLL external clock signal are configurable to be synchronously clocked with respect to the external clock signal.

2. The programmable interconnect circuit of claim 1, wherein an internal feedback signal is associated with the internal clock signal and an external feedback signal is associated with the PLL external clock signal, the PLL being configurable to select either the internal feedback signal or the external feedback signal, the PLL including a phase detector operable to compare a signal derived from the selected feedback signal to a signal derived from the external clock signal.

3. The programmable interconnect circuit of claim 2, wherein the PLL includes a feedback clock divider for frequency dividing the selected feedback signal to produce the signal derived from the selected feedback signal.

4. The programmable interconnect circuit of claim 3, wherein the PLL includes a reference clock divider for frequency dividing the external clock signal to produce to signal derived from the external clock signal.

5. The programmable interconnect circuit of claim 1, wherein the PLL includes a voltage-controlled oscillator (VCO) and a programmable VCO output signal divider cowled to the VCO, the VCO output signal divider operable to divide the frequency of the VCO output signal by a selected factor.

6. The programmable interconnect circuit of claim 1, wherein the PLL includes a programmable phase adjustor coupled between a source of the external clock signal and a phase detector, the phase adjuster operable to adjust the delay of a feedback clock signal with respect to the external clock signal.

7. The programmable interconnect circuit of claim 1, wherein the PLL includes:
a comparison path wherein the external clock signal is compared to a feedback clock signal to generate the internal clock signal;
a bypass path wherein the external clock signal is provided as the internal clock signal; and
a bypass multiplexer wherein the comparison and bypass paths are coupled to input terminals of the bypass multiplexer and an output path for the internal clock is coupled to an output terminal of the multiplexer.

8. A programmable interconnect circuit, comprising:
a plurality of input/output (I/O) cells arranged into a plurality of N I/O blocks, wherein N is an integer and each I/O block includes at least two I/O cells and each I/O cell includes a multiplexer and a register associated with a pin of the programmable interconnect circuit;
a plurality of N routing structures corresponding to the plurality of N I/O blocks, each routing structure configured to receive signals from the plurality of I/O cells and programmably route the signals to each I/O cell within the routing structure's I/O block; and
a phase-locked loop (PLL) operable to receive an external clock signal and provide an internal clock signal to the registers in the I/O cell such that the register in the I/O cells are configurable to be synchronously clocked with respect to the external clock signal.

9. The programmable interconnect circuit of claim 8, wherein the PLL is operable to provide a PLL external clock signal derived from the external clock signal and to couple the PLL external clock signal to one of the I/O cells, wherein the routing structure associated with the I/O cell's I/O block is configurable to distribute the PLL external clock signal to any of the I/O cells's registers such that external devices coupled to the pins associated with the I/O cells receiving the PLL external clock signal are configurable to be synchronously clocked with respect to the external clock signal.

10. A programmable interconnect circuit, comprising:
- a plurality of input/output (I/O) cells operable to receive input signals and to transmit output signals;
- a routing structure coupled to the I/O cells and operable to receive input signals from I/O cells and to provide output signals to I/O cells; and
- a phase-locked loop coupled to an I/O cell and operable to provide a PLL clock signal as an input signal to the I/O cell, the PLL clock signal being routed from the I/O cell to the routing structure, the routing structure operable to provide the PLL clock signal as an output signal to multiple I/O cells.

11. The programmable interconnect circuit of claim 10, wherein the phase-locked loop includes a multiplexer operable to select between internal and external feedback signals as a feedback clock signal and a phase detector operable to compare the selected feedback signal to a reference clock signal in generating the PLL clock signal.

12. The programmable interconnect circuit of claim 10, wherein the phase-locked loop includes a phase detector and a programmable reference clock divider coupled between a source of the reference clock signal and the phase detector, the reference clock divider operable to divide the frequency of the reference clock signal by a selected factor before its comparison by the phase detector with a feedback clock signal.

13. The programmable interconnect circuit of claim 10, wherein the phase-locked loop includes a phase detector and a programmable feedback clock signal multiplier coupled between a source of the feedback clock signal and the phase detector, the feedback clock signal multiplier operable to multiply the frequency of the feedback clock signal by a selected factor before its comparison by the phase detector with a reference clock signal.

14. The programmable interconnect circuit of claim 10, wherein the phase-locked loop includes a voltage controlled oscillator (VCO) and a programmable VCO output signal divider coupled to the VCO, the VCO output signal divider operable to divide the frequency of the VCO output signal by a selected factor.

15. The programmable interconnect circuit of claim 10, wherein the phase-locked loop includes a programmable phase adjustor coupled between a source of a reference clock signal and a phase detector, the phase adjustor operable to adjust the delay of a feedback clock signal with respect to a reference clock signal.

16. The programmable interconnect circuit of claim 10, wherein the phase-locked loop includes:
- a comparison path wherein a reference clock signal is compared to a feedback clock signal in the process of generating the PLL clock signal;
- a bypass path wherein the reference clock signal is provided as the PLL clock signal; and
- a bypass multiplexer wherein the comparison and bypass paths are coupled to input terminals of the multiplexer and an output path for the PLL clock signal is coupled to an output terminal of the multiplexer.

* * * * *

UNITED STATES PATENT AND TRADEMARK OFFICE
CERTIFICATE OF CORRECTION

PATENT NO. : 6,661,254 B1
DATED : December 9, 2003
INVENTOR(S) : Agrawal et al.

It is certified that error appears in the above-identified patent and that said Letters Patent is hereby corrected as shown below:

Column 10,
Line 21, "to" should be -- the --.
Line 26, "cowled" should be -- coupled --.

Signed and Sealed this

Twenty-second Day of June, 2004

JON W. DUDAS
*Acting Director of the United States Patent and Trademark Office*

UNITED STATES PATENT AND TRADEMARK OFFICE
CERTIFICATE OF CORRECTION

PATENT NO. : 6,661,254 B1
DATED : December 9, 2003
INVENTOR(S) : Agrawal et al.

It is certified that error appears in the above-identified patent and that said Letters Patent is hereby corrected as shown below:

Drawings,
Please delete FIG. 3 of 9 and substitute therefore the FIG consisting, FIG 3 of 9 as shown on the attached sheet.

Column 9,
Line 65, "eternal" should be -- external --.

Signed and Sealed this

Fifteenth Day of February, 2005

JON W. DUDAS
*Director of the United States Patent and Trademark Office*

FIG. 3